(12) United States Patent
Nichols et al.

(10) Patent No.: US 9,253,916 B2
(45) Date of Patent: Feb. 2, 2016

(54) CABLE BACKPLANE SYSTEM HAVING A CABLE TRAY GUIDE AND SUPPORT SYSTEM

(71) Applicant: Tyco Electronics Corporation, Berwyn, PA (US)

(72) Inventors: Robert Paul Nichols, Vacaville, CA (US); Christopher David Ritter, Hummelstown, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 224 days.

(21) Appl. No.: 13/951,103

(22) Filed: Jul. 25, 2013

(65) Prior Publication Data
US 2015/0029676 A1    Jan. 29, 2015

(51) Int. Cl.
H05K 7/02    (2006.01)
H05K 7/04    (2006.01)
H05K 7/14    (2006.01)

(52) U.S. Cl.
CPC .................... H05K 7/1491 (2013.01)

(58) Field of Classification Search
CPC .................... H05K 7/14; B23P 6/00
USPC ......... 361/727, 788, 807, 809, 810, 825–826, 361/679.02, 679.31, 796, 756; 174/135; 385/135
See application file for complete search history.

(56) References Cited

U.S. PATENT DOCUMENTS

| | | | | |
|---|---|---|---|---|
| 6,102,214 | A * | 8/2000 | Mendoza .................... | 211/26 |
| 7,409,137 | B2 * | 8/2008 | Barnes ...................... | 385/135 |
| 2004/0264145 | A1 * | 12/2004 | Miller et al. ................ | 361/725 |
| 2009/0245746 | A1 * | 10/2009 | Krampotich et al. ......... | 385/135 |
| 2010/0054682 | A1 * | 3/2010 | Cooke et al. ................ | 385/135 |

OTHER PUBLICATIONS

EIC 2800 Search Report, STIC Data Database Tracking No. 481481.*

* cited by examiner

Primary Examiner — Hung S Bui

(57) ABSTRACT

A cable backplane system includes a backplane and a chassis supporting the backplane. A cable rack is coupled to the chassis and backplane. The cable rack includes upper trays and lower trays each having a frame and cable connector assemblies held by the corresponding frame. The upper trays have upper tray guides configured to interact with corresponding upper chassis guides on the upper support for supporting the upper trays relative to the backplane. The lower trays have lower tray guides configured to interact with corresponding lower chassis guides on the lower support for aligning the lower trays to the backplane. The upper trays have upper hanging guides and the lower trays have lower hanging guides coupled to corresponding upper hanging guides to support the lower trays with the corresponding upper trays relative to the backplane.

20 Claims, 8 Drawing Sheets

CABLE BACKPLANE SYSTEM HAVING A CABLE TRAY GUIDE AND SUPPORT SYSTEM

BACKGROUND OF THE INVENTION

The subject matter herein relates generally to cable backplane systems having a cable tray guide and support system.

Communication systems, such as network systems, servers, data centers, and the like, use large printed circuit boards, known as backplanes, to interconnect midplanes, daughtercards, line cards and/or switch cards. The communication systems use high speed differential connectors mounted to the backplane and high speed differential connectors mounted to the line cards and switch cards to transmit signals therebetween. The backplane interconnects the various connectors using traces along the circuit board.

As the density of the systems increase and requirements for high speed lines increase, the printed circuit boards continue to become larger and the signal integrity inherently degrades as the signals travel further along the entire channel. At least some systems have replaced the traditional backplanes with cable assemblies. However, packaging of large numbers of cable assemblies is difficult. Cable management is a limiting factor in such systems. Additionally, assembly of such systems with the large number of cables is problematic. For high density cable backplane systems, space is limited and the cable trays need to be stacked directly adjacent one another. Access to components of the cable tray, such as spacers that are used to mount cable assemblies to the backplane, may be difficult or even impossible, particularly in designs where individual cable assemblies with each cable tray must independently reference a specified datum within the chassis. The cable tray may be heavy and difficult to support and position for mounting to the backplane.

A need remains for a cable backplane system that may be assembled in a cost effective and reliable manner.

BRIEF DESCRIPTION OF THE INVENTION

In one embodiment, a cable backplane system is provided that includes a backplane having a plurality of openings therethrough and a chassis supporting the backplane. The chassis has an upper support and a lower support. The upper support has chassis guides. A cable rack is coupled to the chassis and backplane between the upper and lower supports. The cable rack includes a plurality of trays each having a frame surrounding a raceway and cable connector assemblies held by the corresponding frame. Each cable connector assembly has a plurality of cables extending between at least two cable connectors that are routed in the corresponding raceway. The trays have tray guides configured to interact with corresponding chassis guides for supporting the trays relative to the backplane for loading the cable connectors into corresponding openings in the backplane.

In another embodiment, a cable backplane system is provided including a backplane having a plurality of openings therethrough and a chassis supporting the backplane. The chassis has an upper support, a lower support and side supports extending between the upper and lower supports. The upper support has upper chassis guides and the lower support has lower chassis guides. A cable rack is coupled to the chassis and backplane between the upper and lower supports. The cable rack includes a plurality of upper trays and a plurality of lower trays. Each of the upper and lower trays has a frame surrounding a raceway and cable connector assemblies held by the corresponding frame. Each cable connector assembly has a plurality of cables extending between at least two cable connectors that are routed in the corresponding raceway. The upper trays have upper tray guides configured to interact with corresponding upper chassis guides for supporting the upper trays relative to the backplane for loading the cable connectors into corresponding openings in the backplane. The lower trays have lower tray guides configured to interact with corresponding lower chassis guides for aligning the lower trays to the backplane for loading cable connectors of the lower tray in corresponding openings in the backplane.

In a further embodiment, a cable backplane system is provided including a backplane having a plurality of openings therethrough and a chassis supporting the backplane. The chassis has an upper support, a lower support and side supports extending between the upper and lower supports. The upper support has upper chassis guides. A cable rack is coupled to the chassis and backplane between the upper and lower supports. The cable rack includes a plurality of upper trays and a plurality of lower trays. Each of the upper and lower trays has a frame surrounding a raceway and cable connector assemblies held by the corresponding frame. Each cable connector assembly has a plurality of cables extending between at least two cable connectors that are routed in the corresponding raceway. The upper trays have upper tray guides configured to interact with corresponding upper chassis guides for supporting the upper trays relative to the backplane. The upper trays have upper hanging guides. The lower trays have lower hanging guides coupled to corresponding upper hanging guides to support the lower trays with the corresponding upper trays relative to the backplane.

DETAILED DESCRIPTION OF THE INVENTION

Figure 1:
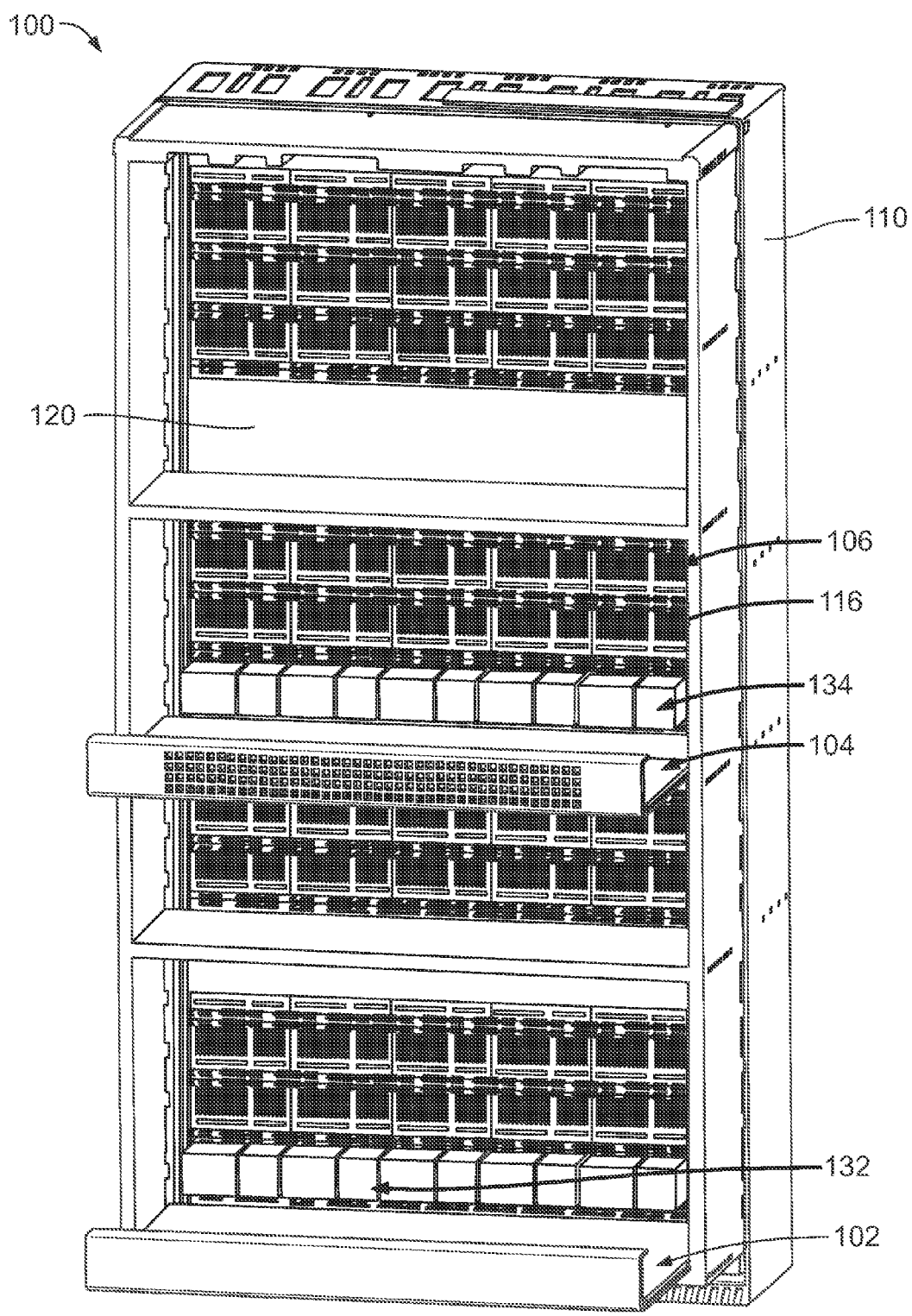
FIG. 1 is a front perspective view of a cable backplane system formed in accordance with an exemplary embodiment.
Figure 2:
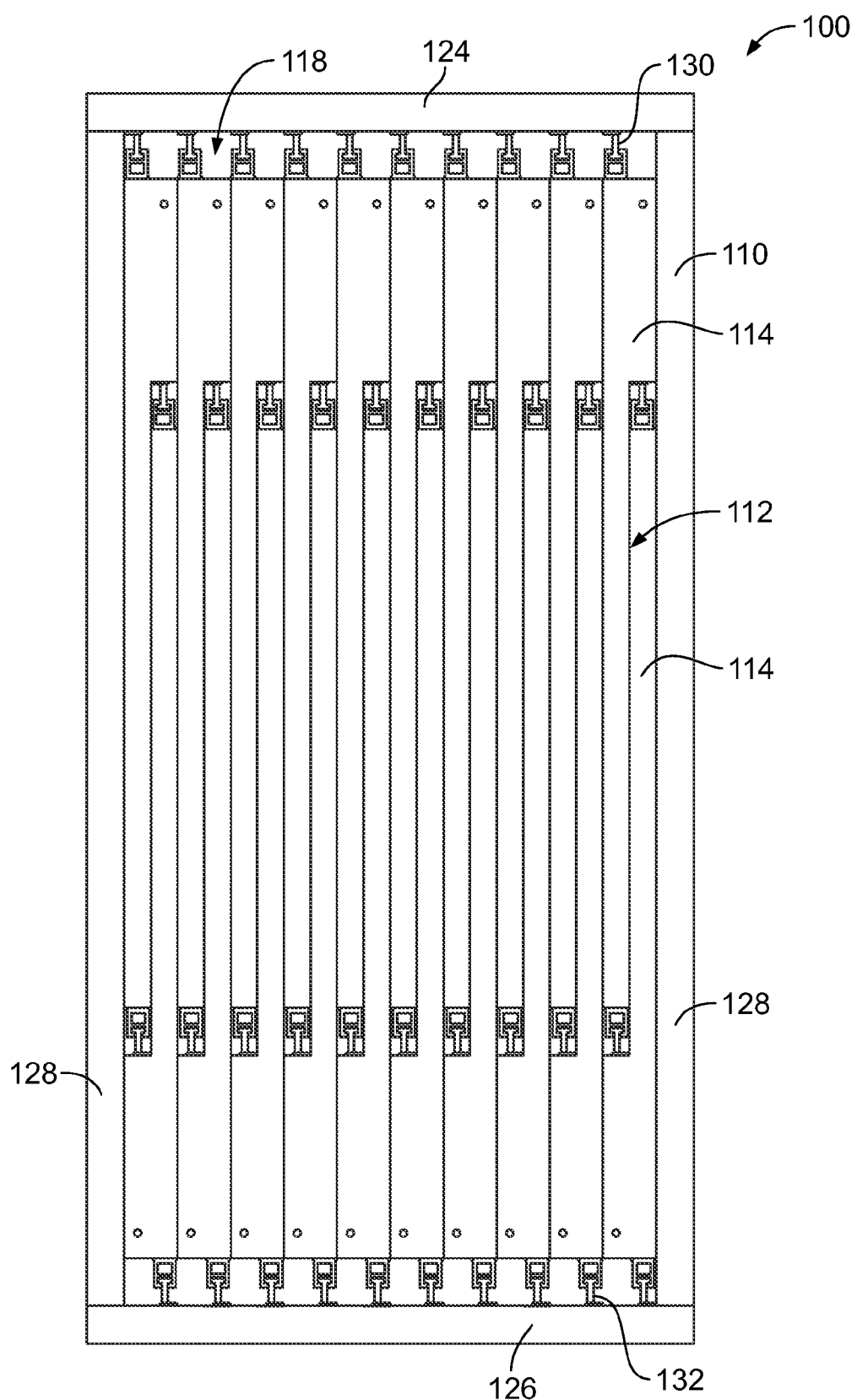
FIG. 2 is a rear perspective view of the cable backplane system.

FIG. 1 is a front perspective view of a cable backplane system 100 formed in accordance with an exemplary embodiment. FIG. 2 is a rear perspective view of the cable backplane system 100. The cable backplane system 100 is used in a data communication application, such as a network switch. The cable backplane system 100 interconnects line cards 102 and switch cards 104 using cable connector assemblies 106. The cable backplane system 100 may be used to interconnect with other types of connectors and/or cards, such as daughtercards, in other embodiments.

The cable connector assemblies 106 include cable connectors 116 that are interconnected by cables within the cable backplane system 100. The cable connector assemblies 106 eliminate interconnections via traces of a circuit board, such as a backplane circuit board. The cable connector assemblies 106 have improved signal performance along the signal paths between various connectors of the cable backplane system 100 as compared to conventional backplanes. The cable connector assemblies 106 support higher speeds, longer signal path lengths and lower cost per channel as compared to conventional backplanes. The cable connector assemblies 106 provide shielding of signal lines for improved signal performance. The cable connector assemblies 106 are packaged in a structure that allows accurate cable and connector location for mating with the corresponding line cards 102 and switch cards 104.

The cable backplane system 100 includes a chassis 110 that supports the components of the cable backplane system 100. The chassis 110 may include a rack, a cabinet or other suitable structures for holding the components of the cable backplane system 100. The chassis 110 may include structures for guiding, supporting and/or securing the line cards 102 and switch cards 104 coupled to the cable backplane system 100. In an exemplary embodiment, the chassis 110 is used to support the weight of the cable connector assemblies 106 and corresponding structure as the cable connector assemblies are properly positioned.

The cable backplane system 100 includes a cable rack 112 (shown in FIG. 2) that supports and/or manages the cables of the cable connector assemblies 106. The cable rack 112 includes a plurality of trays 114 (shown in FIG. 2) that are held together and extend along different portions of the cable backplane system 100. The trays 114 may be box-shaped and define raceways for the cables. The cable rack 112 supports a plurality of the cable connectors 116 which form parts of the cable connector assemblies 106. The cable backplane system 100 includes a tray guide and support system 118 that guides and supports the trays 114 during installation. The weight of the trays 114 is supported by the guide and support system 118 to ease installation.

The cable backplane system 100 includes a backplane 120. The backplane 120 is supported by the chassis 110. The backplane 120 may be secured to the chassis 110 using fasteners or by other means. The backplane 120 may be a circuit board and may be manufactured from typical circuit board material, such as FR-4 material. Electrical components, such as power supplies, fans, connectors, and the like may be attached to the backplane 120. Such electrical components may be electrically connected to traces or circuits of the backplane 120. The cable connectors 116 are not electrically connected to the backplane 120, as is typical of conventional backplanes, but rather the cable connectors 116 are interconnected by cables extending between the cable connectors 116. The backplane 120 may be manufactured from other materials in alternative embodiments, such as another dielectric material or a metal material, such as a metal sheet, such as when no electrical routing on the backplane 120 is required.

The cable rack 112 is provided along a rear of the backplane 120. The cable connectors 116 extend through openings 122 (shown in FIG. 3) in the backplane 120 and are presented at a front of the backplane 120 for mating with the line and switch cards 102, 104. In an exemplary embodiment, the cable connectors 116 are held in precise locations for mating with the line cards 102 and/or switch cards 104. The cable rack 112 may include features that align and position the cable connectors 116 with respect to the backplane 120. The backplane 120 may include features that ensure that the cable connectors 116 are properly aligned and positioned for mating with the line cards 102 and/or the switch cards 104. For example, the openings 122 may be used to align the cable connectors 116.

In an exemplary embodiment, the chassis 110 includes an upper support 124, a lower support 126 and side supports 128 extending between the upper and lower supports 124, 126. The supports 124, 126, 128 may be metal bars or frames. The backplane 120 is secured to the side supports 128 and is positioned between the upper and lower supports 124, 126. In an exemplary embodiment, the chassis 110 includes chassis guides 130, 132 along the upper and lower supports 124, 126 that are used to support and guide loading and unloading of the individual trays 114 in to and out of the cable rack 112. The chassis guides 130, 132 may be referred to hereinafter as upper chassis guides 130 and lower chassis guides 132. The chassis guides 130, 132 may define part of the guide and support system 118.

During assembly and positioning of the trays 114 and cable connectors 116, the trays 114 are coupled to corresponding chassis guides 130, 132. The chassis guides 130, 132 are used to support the weight of the trays 114 such that the trays 114 and cable connectors 116 may be more easily manipulated and aligned with the backplane 120. Once positioned, the trays 114 are secured to the backplane 120, such as by using fasteners or inject/eject handles as in a traditional card application, to maintain the positions of the cable connectors 116 for mating with the line cards 102 and/or the switch cards 104. Because of the high density of the trays 114 and the limited access to the trays 114, the chassis 110 is used to support and generally position the trays 114 relative to the backplane 120, where the installer can more easily manipulate and move the tray 114 and/or the cable connectors 116 into position relative to the backplane 120. Once assembled, the backplane 120 supports the weight of the tray 114 and cable connector assemblies 106.

In an exemplary embodiment, the cable rack 112 is flexible to allow the individual cable connectors 116 to align with and pass through the corresponding openings 122. For example, the sheet metal boxes of the trays 114 may be able to flex, twist or move to align with the backplane 120. The cable connectors 116 may be able to float or move relative to the tray 114 to align with the openings 122. Optionally, portions of the trays 114 and/or the cable connectors 116 may pass through the openings 122. The trays 114 may float relative to each other and with respect to the backplane 120 to properly align the cable connectors 116 with the corresponding openings 122. Once assembled, the backplane 120 may be used to hold the cable connectors 116 in precise locations for mating with the line and switch cards 102, 104. For example, the openings 122 may be used to control the final position of the cable connectors 116 for mating. In an exemplary embodiment, the cable connectors 116 float relative to one another and relative to the trays 114 to allow precise positioning of the cable connectors 116 relative to the backplane 120 for mating with the line and switch cards 102, 104. The line and switch cards 102, 104 have card connectors 134, 136, respectively, that mate with corresponding cable connectors 116. The cable connectors 116 are precisely positioned relative to the backplane 120 for mating with corresponding card connectors 134, 136.

Figure 3:
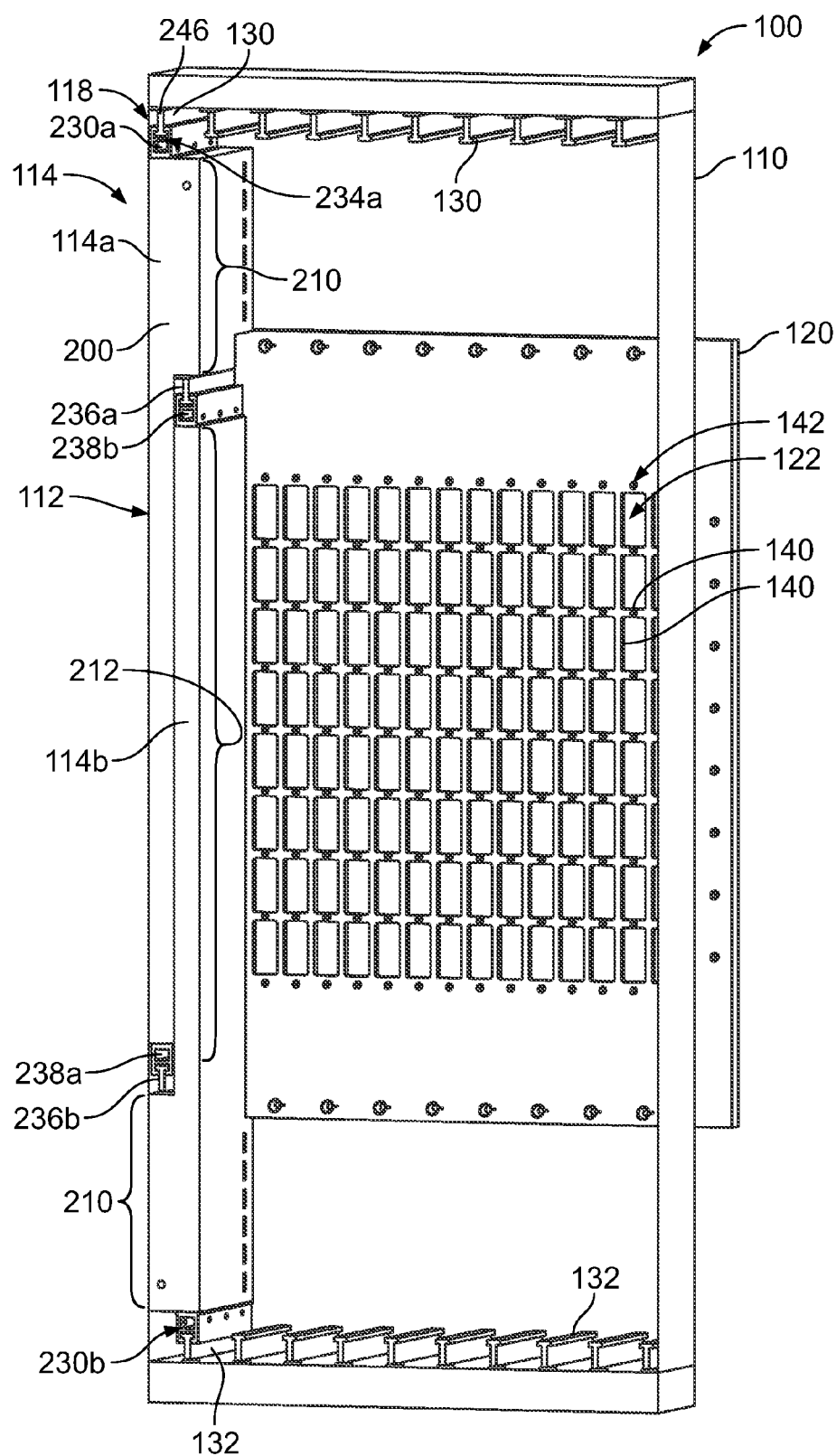
FIG. 3 illustrates a portion of the cable backplane system.

FIG. 3 illustrates the cable backplane system 100 with many of the trays 114 removed for clarity, only showing a pair of the trays 114 mounted to the chassis 110 and backplane 120. A plurality of the openings 122 are visible in FIG. 3. Each opening is sized and shaped to receive a single cable connector 116 (shown in FIG. 1) therein; however the openings 122 may be sized to receive multiple cable connectors 116 therein in alternative embodiments.

The backplane 120 includes crossbars 140 between adjacent openings 122. The crossbars 140 provide support for the backplane 120. The crossbars 140 define mounting locations of the backplane 120 for securing the cable connector assemblies 106 and/or the cable rack 112 to the backplane 120. Optionally, the crossbars 140 may provide a mounting location for mounting blocks or bars (not shown), which may be metal blocks that extend across the front of the backplane 120 to stiffen the backplane 120. In an exemplary embodiment, the backplane 120 includes guide holes 142 through the crossbars 140 that are used for guidance or alignment of the cable connector assemblies 106 and/or the cable rack 112 during assembly. The guide holes 142 receive guide features, fasteners or other components used to assemble the cable backplane system 100.

Figure 4:
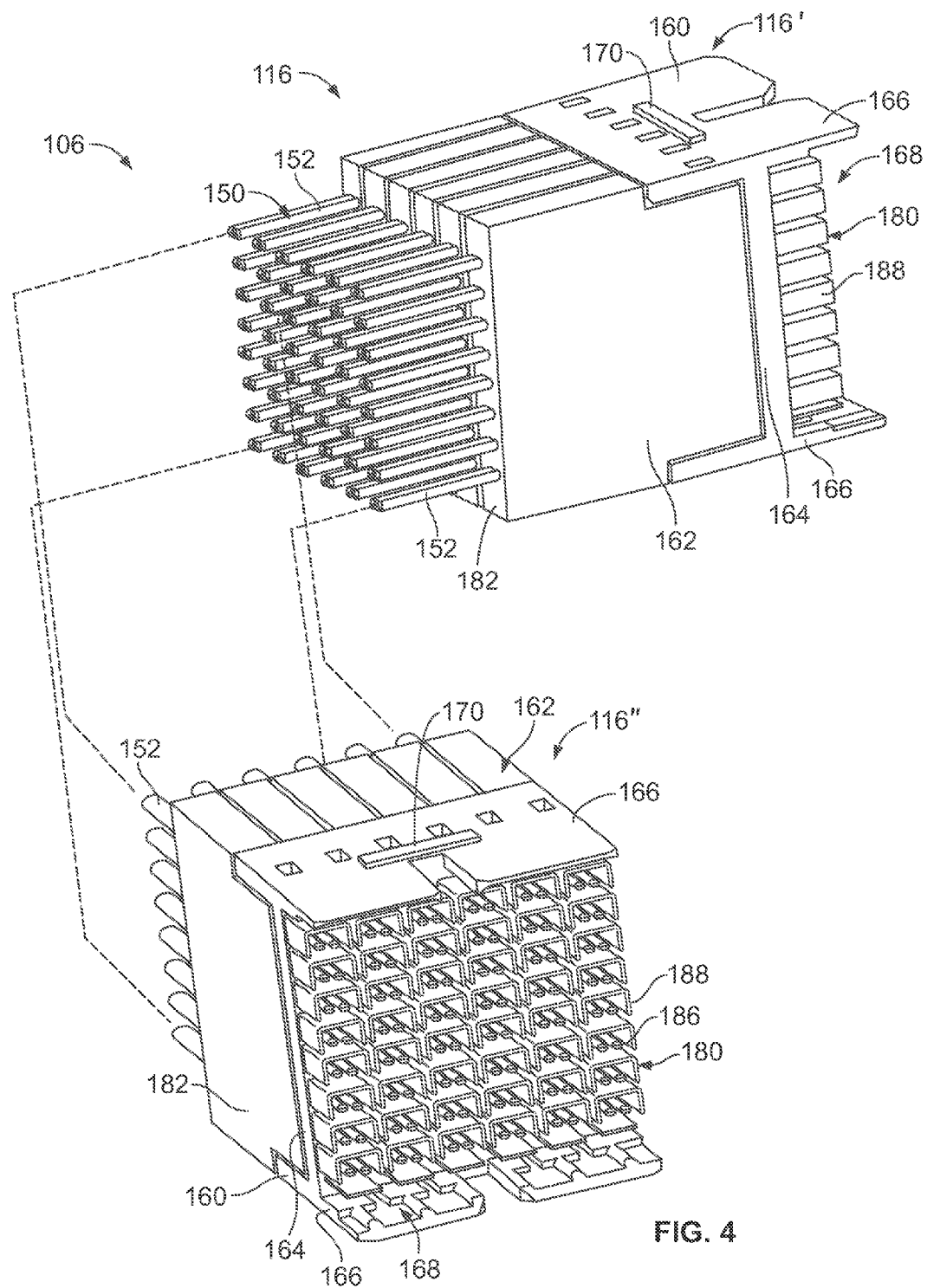
FIG. 4 illustrates a cable connector assembly for the cable backplane system and formed in accordance with an exemplary embodiment.

FIG. 4 illustrates a cable connector assembly 106 formed in accordance with an exemplary embodiment. The cable connector assembly 106 includes a plurality of the cable connectors 116, which may be referred to hereinafter as first and second cable connectors 116', 116", and a cable bundle 150 between the cable connectors 116. The cable connectors 116 are provided at ends of the cable bundle 150. The cable bundle 150 includes a plurality of cables 152. Optionally, the first cable connector 116' may be connected to a card connector 134 (shown in FIG. 1) of a line card 102 (shown in FIG. 1) and the second cable connector 116" may be connected to a card connector 136 (shown in FIG. 1) of the switch card 104 (shown in FIG. 1).

Optionally, the cable connectors 116 may be identical to one another. The cable connectors 116 may define header connectors. The cable connectors 116 are configured to be mated with corresponding card connectors 134, 136, which may be receptacle connectors, such as STRADA Whisper receptacle connectors, commercially available from TE Connectivity, Harrisburg, Pa. In an exemplary embodiment, the cable connector 116 is a high speed differential pair cable connector that includes a plurality of differential pairs of conductors mated at a common mating interface. The differential conductors are shielded along the signal paths thereof to reduce noise, crosstalk and other interference along the signal paths of the differential pairs.

In an exemplary embodiment, the cables 152 are twin axial cables having two signal wires within a common jacket of the cable 152. The signal wires convey differential signals. In an exemplary embodiment, the signal wires are shielded, such as with a cable braid or metal foil of the cable 152. Optionally, each of the signal wires may be individually shielded. Other types of cables 152 may be provided in alternative embodiments. For example, coaxial cables may extend from the cable connector 116 each carrying a single signal conductor therein.

The cable connector 116 includes a header housing 160 holding a plurality of contact modules 162. The header housing 160 includes a base wall 164 and shroud walls 166 extending from the base wall 164 to define a mating cavity 168 configured to receive the corresponding card connector 134, 136. The shroud walls 166 guide mating of the card connector 134, 136 with the cable connector 116. In an exemplary embodiment, the header housing 160 has lugs 170 extending outward from the walls 166. The lugs 170 are used to locate the cable connector 116 with respect to the corresponding tray 114 (shown in FIG. 2).

Each of the contact modules 162 includes a plurality of cable assemblies 180 held by a support body 182. Each cable assembly 180 includes a pair of signal contacts 186 terminated to corresponding signals wires of the cable 152. Each cable assembly 180 also includes a ground shield 188 providing shielding for the signal contacts 186. In an exemplary embodiment, the ground shield 188 peripherally surrounds the signal contacts 186 along the entire length of the signal contacts 186 to ensure that the signal paths are electrically shielded from interference.

The support body 182 provides support for the cable assemblies 180. The cables 152 extend into the support body 182 such that the support body 182 supports a portion of the cables 152. The support body 182 may provide strain relief for the cables 152. Optionally, the support body 182 may be manufactured from a plastic material. Alternatively, the support body 182 may be manufactured from a metal material. The support body 182 may be a metalized plastic material to provide additional shielding for the cables 152 and the cable assemblies 180. Optionally, the support body 182 may include a metal plate electrically connected to each ground shield to electrically common each ground shield 188 and a dielectric overmold around the cables 152 and portions of the metal plate to support the cables 152 and cable assemblies 180.

Multiple contact modules 162 are loaded into the header housing 160. The header housing 160 holds the contact modules 162 in parallel such that the cable assemblies 180 are aligned in a column. Any number of contact modules 162 may be held by the header housing 160 depending on the particular application. When the contact modules 162 are stacked in the header housing 160, the cable assemblies 180 may also be aligned in rows.

Figure 5:
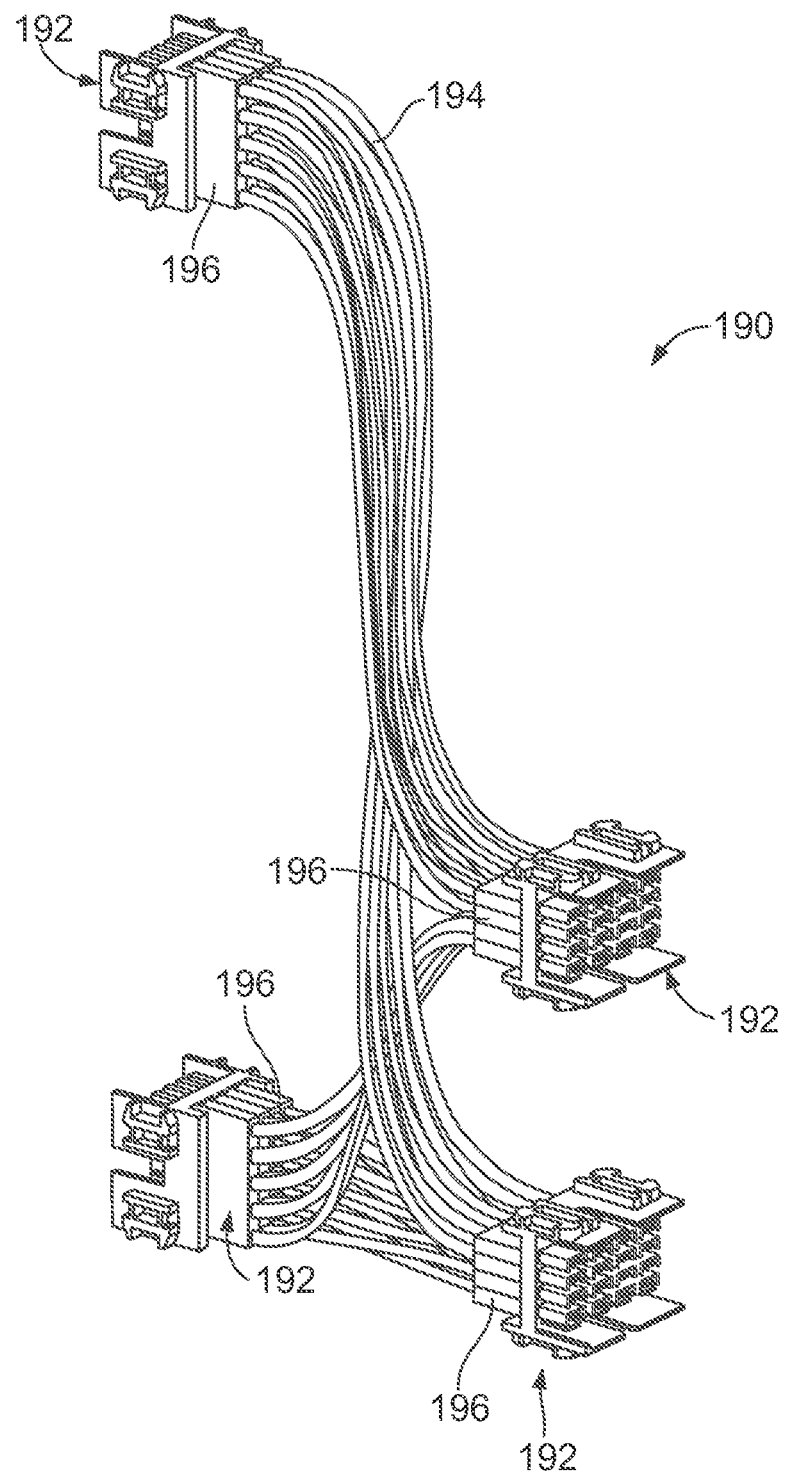
FIG. 5 illustrates a cable connector assembly for the cable backplane system and formed in accordance with an exemplary embodiment.

FIG. 5 illustrates a cable connector assembly 190 formed in accordance with an exemplary embodiment. The cable connector assembly 190 is similar to the cable connector assembly 106 (shown in FIG. 4); however the cable connector assembly 190 includes more cable connectors 192 (e.g. four cable connectors 192 are shown in the embodiment illustrated in FIG. 5). Some of the cable connectors 192 may be used to interconnect with receptacle or card connectors 136 associated with the switch card 104 (both shown in FIG. 1), such as the bottom two cable connectors 192, while other cable connectors 192 may be used to interconnect with receptacle or card connectors 134 associated with the line card 102 (both shown in FIG. 1). Optionally, cables 194 from the same cable connector 192, such as cables from different contact modules 196, may be routed to several other cable connectors 192.

Figure 6:
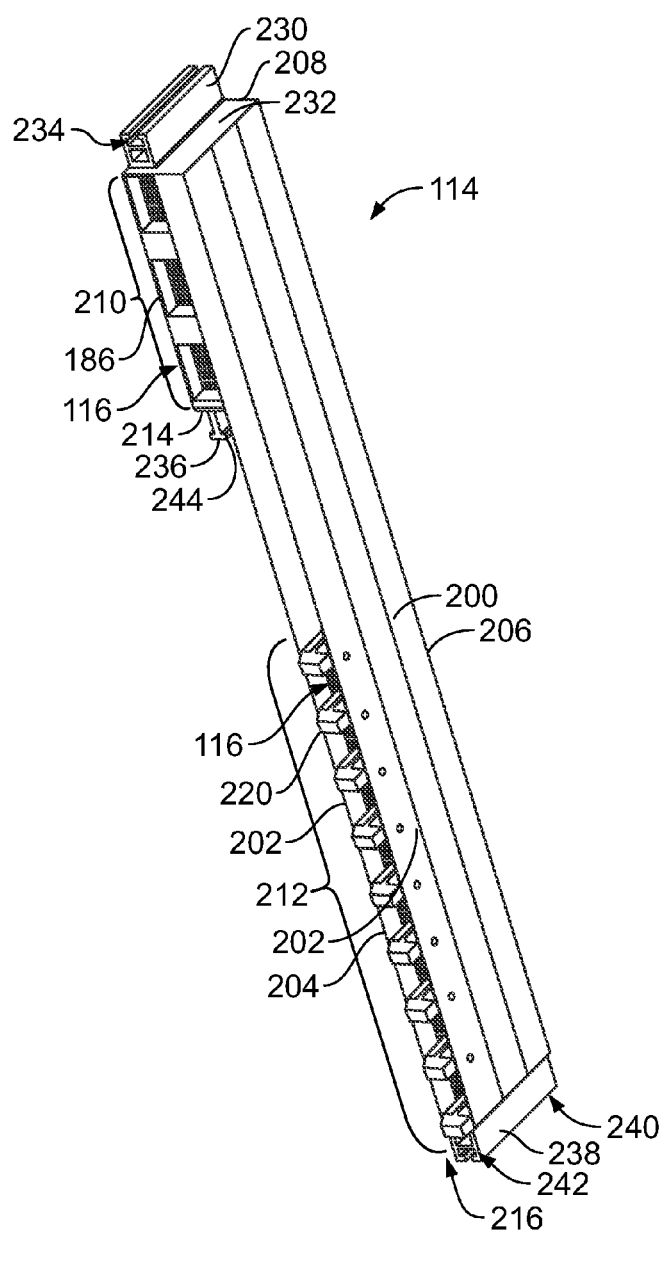
FIG. 6 is a perspective view of a tray for the cable backplane system and formed in accordance with an exemplary embodiment.
Figure 7:
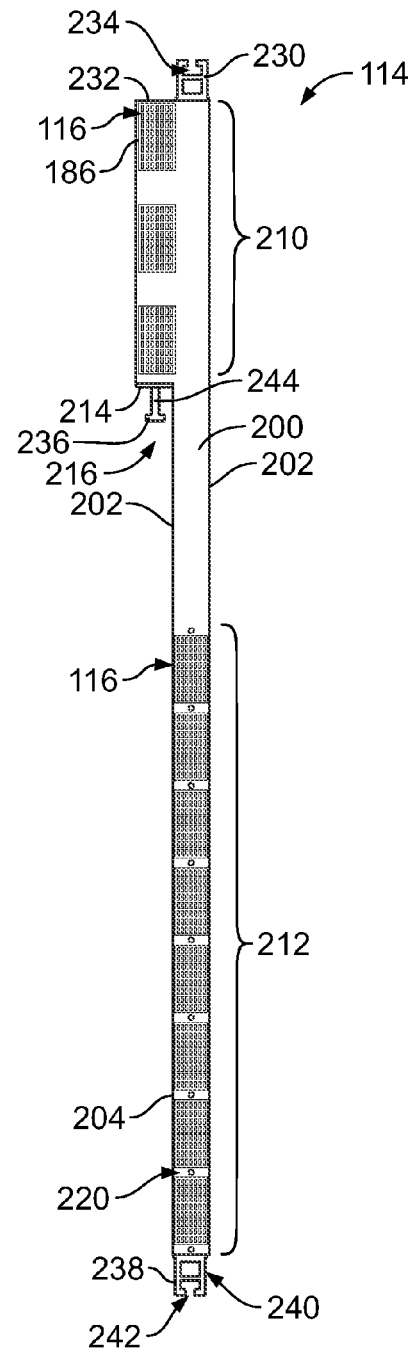
FIG. 7 is a front view of the tray.
Figure 8:
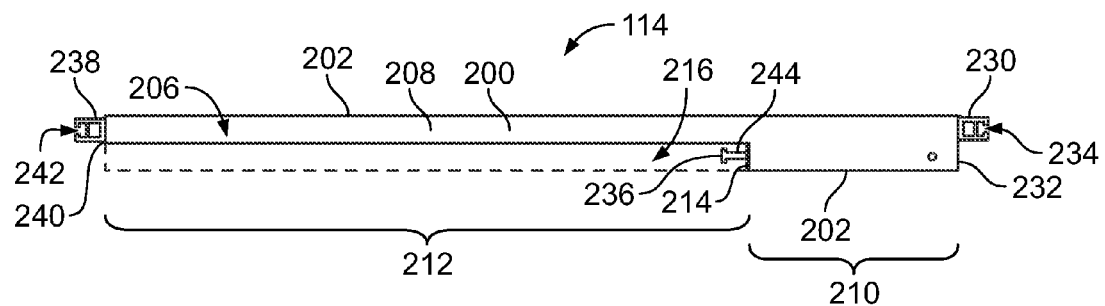
FIG. 8 is a rear view of the tray.

FIG. 6 is a front perspective view of one of the trays 114 formed in accordance with an exemplary embodiment. FIG. 7 is a front view of the tray 114. FIG. 8 is a rear view of the tray 114. The tray 114 includes a frame 200 surrounding a raceway through which the cables 152 (shown in FIG. 4) are routed. The frame 200 includes side walls 202 extending between a front edge 204 and a rear 206 of the frame 200. A back wall 208 (FIG. 8) covers the raceway at the rear 206. The frame 200 is open at the front edge 204 between the side walls 202 to receive the cable connectors 116 therein.

In an exemplary embodiment, the side walls 202 and back wall 208 are sheet metal pieces that are stamped, formed and coupled together, such as using fasteners or other connecting means. The sheet metal may be thin enough to allow the frame 200 to have some flexibility for moving, twisting or otherwise manipulating the trays 114 into position relative to the backplane 120 (shown in FIG. 3) to position the cable connectors 116 in the openings 122 (shown in FIG. 3) in the backplane 120.

In an exemplary embodiment, the tray 114 includes a first section 210 and a second section 212 extending from the first section 210. The first section 210 is wider than the second section 212 defining a ledge 214. A pocket 216 (shown in phantom in FIG. 8) is defined in the space beyond the ledge 214 of the first section 210 alongside of the second section 212. In one orientation, the first section 210 may be positioned above the second section 212 such that the pocket 216 is positioned below the ledge 214 of the first section 210. In another orientation, the first section 210 may be positioned below the second section 212 such that the pocket 216 is positioned above the ledge 214 of the first section 210. Optionally, the first section 210 may hold cable connectors 116 that are configured for mating with the card connectors 134 associated with the line card 102 (both shown in FIG. 1) while the second section may hold cable connectors 116 that are configured for mating with the card connectors 136 associated with the switch card 104 (both shown in FIG. 1). The first section 210 may be referred to hereinafter as a line card section 210 while the second section 212 may be referred to hereinafter as a switch card section 212. The tray 114 may have different sections in alternative embodiments.

The frame 200 in the line card section 210 may be different than the frame 200 in the switch card section 212. For example, the frame 200 in the line card section 210 may be wider than the frame 200 in the switch card section 212, such as to accommodate different sized cable connectors 116. In the illustrated embodiment, the cable connectors 116 in the line card section 210 are larger than the cable connectors 116 in the switch card section 212 and have more pairs of signal contacts 186. For example, the cable connectors 116 in the line card section 210 are 16×8 connectors having sixteen pairs of signal contacts 186 in each row and eight pairs of signal contacts 186 in each column, whereas the cable connectors 116 in the switch card section 212 are 6×8 connectors having six pairs of signal contacts 186 in each row and eight pairs of signal contacts in each column. Other combinations are possible in alternative embodiments.

The tray 114 includes a plurality of spacers 220 used to hold positions of the cable connectors 116. The spacers 220 in the line card section 210 may be different types than the spacers 220 in the switch card section 212. For example, the spacers 220 may have different sizes, shapes and/or features, such as guide pins. The spacers 220 function to support one or more cable connectors 116 within the frame 200. The spacers 220 align and position the cable connectors 116 with respect to the backplane 120. The spacers 220 may be secured to the backplane 120, such as using fasteners, spring actuated pins or other securing means to position the cable connectors 116 relative to the backplane 120.

The tray 114 includes a tray guide 230 extending from the first section 210 at a first end 232 of the tray 114. The tray guide 230 is configured to interact with a corresponding chassis guide 130, 132 (shown in FIG. 2) for supporting the tray 114 relative to the backplane 120 for loading the cable connectors 116 into corresponding openings 122 in the backplane 120. In the illustrated embodiment, the tray guide 230 includes a channel 234 that is configured to receive the corresponding chassis guide 130, 132. The channel 234 may be a T-shaped channel, however the channel 234 may have other shapes in alternative embodiments. The tray guide 230 may have other shapes or features that interact with the chassis guides 130, 132 to support the tray 114 with the chassis 110 in alternative embodiments.

In an exemplary embodiment, the tray 114 includes first and second hanging guides 236, 238 that are used to connect the tray 114 to an adjacent tray 114 within the cable rack 112.

The first hanging guide 236 extends from the ledge 214 of the first section 210. The first hanging guide 236 is located in the pocket 216. The second hanging guide 238 extends from the second section 212 at a second end 240 of the tray 114. Optionally, the second hanging guide 238 may be similar in size and shape to the tray guide 230. The second hanging guide 238 may have a channel 242 similar in size and shape to the channel 234. The first hanging guide 236 may include a post 244. Optionally, the post 244 may be T-shaped, however the post 244 may have other shapes in alternative embodiments. The tray guides 230 and the hanging guides 236, 238 may define part of the guide and support system 118.

With reference back to FIG. 3, during assembly, the trays 114 are arranged in the chassis 110 in pairs with the trays 114 of each pair being inverted with respect to one another. One tray 114 in each pair is arranged with the line card section 210 along the top of the cable rack 112 and the other tray 114 in each pair is arranged with the line card section 210 along the bottom of the cable rack 112. The switch card sections 212 of the trays 114 are aligned along the center section of the cable rack 112. Such an arrangement allows for tight packing of the trays 114 in the chassis 110 even though the line card section 210 and switch card section 212 have different widths. Other configurations are possible in alternative embodiments.

The tray 114 arranged with the line card section 210 along the top of the cable rack 112 may be referred to hereinafter as an upper tray 114a, and components thereof may be designated with an "a" designation or an "upper" designation to differentiate from the other tray 114 of the pair. The tray 114 arranged with the line card section 210 along the bottom of the cable rack 112 may be referred to hereinafter as a lower tray 114b, and components thereof may be designated with a "b" designation or a "lower" designation to differentiate from the upper tray 114a. In an exemplary embodiment, the upper and lower trays 114a, 114b are identical and are merely inverted in the chassis 110 when installed. Alternatively, the upper and lower trays 114a, 114b may be different, such as by having different shapes, different arrangement of cable connectors 116 (shown in FIG. 6), different types of tray guides 230 and/or hanging guides 236, 238.

During assembly, the upper tray 114a is loaded into the chassis 110 from the rear of the chassis 110. The guide and support system 118 is used to assist in loading and positioning the upper tray 114a with respect to the backplane 120. The upper tray 114a is attached to the upper chassis guide 130 and slid forward into position with respect to the backplane 120. The upper tray guide 230a interacts with the upper chassis guide 130 to support and guide the upper tray 114a into position with respect to the backplane 120. In an exemplary embodiment, the upper chassis guide 130 includes a post 246 that is received in the channel 234a of the upper tray guide 230a. Optionally, the post 246 may be a T shaped post that is received in the T-shaped channel 234a. The upper tray 114a is supported by the upper chassis guide 130. The upper tray 114a is allowed to slide along the upper chassis guide 130 with the upper chassis guide 130 supporting the weight of the upper tray 114a. Once the upper tray 114a is positioned immediately rearward of the backplane 120, the upper tray 114a and corresponding cable connectors 116 may be manipulated and moved to fit within the openings 122 in the backplane 120. The upper tray 114a may be lifted off of the upper chassis guide 130 and coupled to the backplane 120, such as using fasteners to secure the spacers 220, or other portions of the frame 200 (both shown in FIG. 6), to the backplane 120. When the upper tray 114a is lifted off of the upper chassis guide 130, the weight of the upper tray 114a may be supported by the backplane 120.

Figure 9:
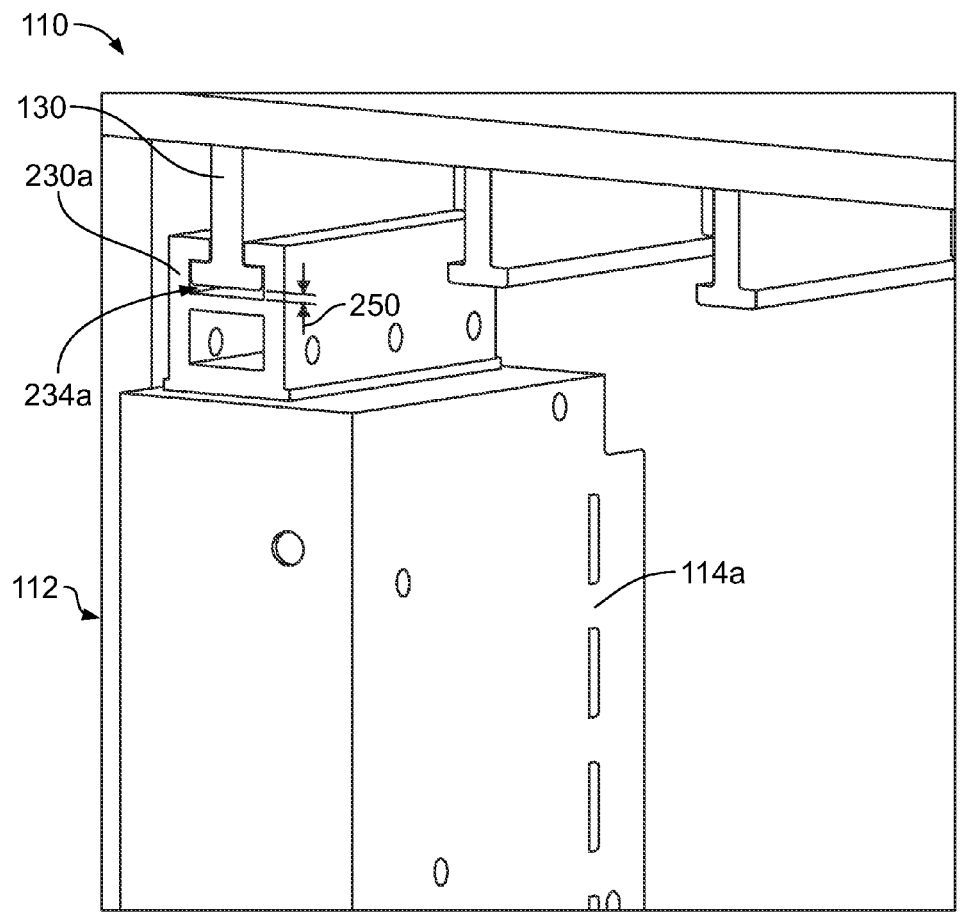
FIG. 9 illustrates portion of the cable backplane system showing trays coupled to a guide system.

FIG. 9 is an enlarged view of the portion of the chassis 110 and cable rack 112 showing one of the upper trays 114a coupled to the upper chassis guide 130. In an exemplary embodiment, the channel 234a is oversized relative to the upper chassis guide 130 such that a gap 250 is formed in the channel 234a. The gap 250 provides clearance to allow the upper tray guide 230a to move relative to the upper chassis guide 130. For example, the upper tray 114a may be lifted upward off of the upper chassis guide 130 to allow positioning of the upper tray 114a relative to the backplane 120 (shown in FIG. 3).

Returning to FIG. 3, the lower tray 114b may be loaded into the chassis 110 after the upper tray 114a is loaded into the chassis 110 and/or secured to the backplane 120. The lower tray 114b is inverted or flipped 180° with respect to the upper tray 114a and loaded into the chassis 110 in such inverted orientation. The lower tray guide 230b is aligned with the lower chassis guide 132 and the lower chassis guide 132 may be used to locate and/or support the lower tray 114b during assembly.

In an exemplary embodiment, the lower tray 114b is coupled to the upper tray 114a to help guide and support the lower tray 114b during assembly. For example, the second hanging guide 238b of the lower tray 114b is coupled to the first hanging guide 236a of the upper tray 114a. The lower tray 114b hangs from the upper tray 114a. The upper tray 114a thus supports the lower tray 114b as the lower tray 114b is moved into position relative to the backplane 120. In an exemplary embodiment, the first hanging guide 236b of the lower tray 114b is received in the second hanging guide 238a of the upper tray 114a. The upper hanging guide 238a supports the lower tray 114b. Once the lower tray 114b is positioned immediately behind the backplane 120, the lower tray 114b and/or the cable connectors 116 thereof may be manipulated and moved into position relative to the backplane 120 and the openings 122.

Figure 10:
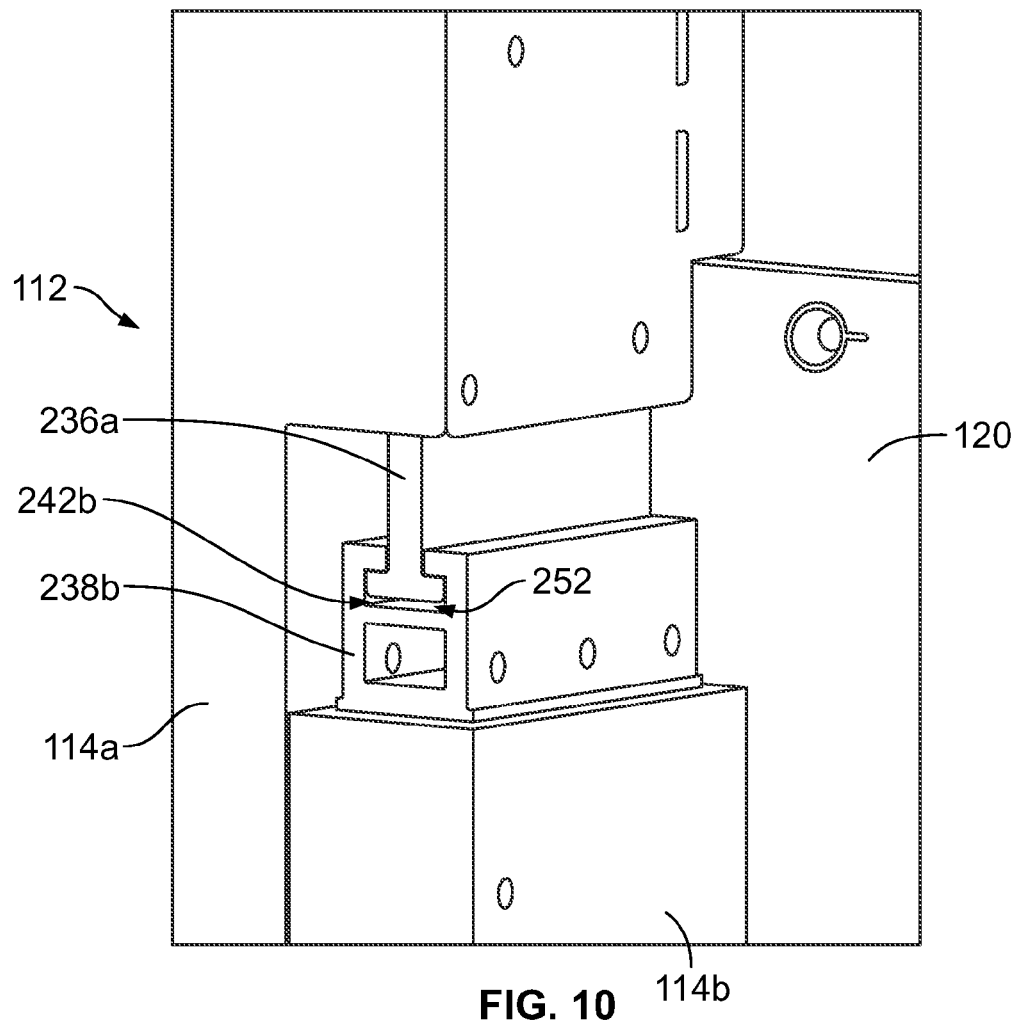
FIG. 10 illustrates a portion of the cable backplane system showing trays coupled to a guide system.

FIG. 10 illustrates a portion of the cable rack 112 showing the lower tray 114b coupled to the upper tray 114a. FIG. 10 illustrates the upper hanging guide 236a supporting the lower hanging guide 238b. The upper hanging guide 236a is received in the channel 242b of the lower hanging guide 238b. In an exemplary embodiment, a gap 252 is formed in the channel 242b of the lower hanging guide 238b. The gap 252 provides clearance to allow the lower tray 114b to move relative to the upper tray 114a. For example, the lower tray 114b may be lifted upward by the installer to position the lower tray 114b and/or the cable connectors 116 (shown in FIG. 6) in proper position with respect to the backplane 120 and openings 122 (shown in FIG. 3). When the lower tray 114b is lifted off of the upper hanging guide 236a, the weight of the lower tray 114b is no longer supported by the upper tray 114a. When the lower tray 114b is secured to the backplane 120, the backplane 120 supports the weight of the lower tray 114b.

Figure 11:
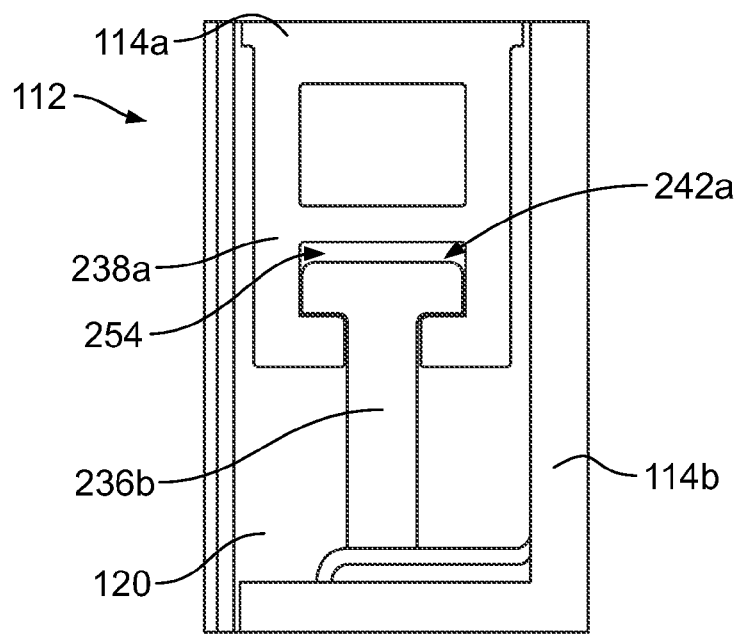
FIG. 11 illustrates a portion of the cable backplane system showing trays coupled to a guide system.

FIG. 11 illustrates a portion of the cable rack 112 showing the lower tray 114b coupled to the upper tray 114a. FIG. 11 illustrates the upper hanging guide 238a supporting the lower hanging guide 236b. The lower hanging guide 236b is received in the channel 242a of the upper hanging guide 238a. In an exemplary embodiment, a gap 254 is formed in the channel 242a of the upper hanging guide 238a. The gap 254 provides clearance to allow the lower tray 114b to move relative to the upper tray 114a. For example, the lower tray 114b may be lifted upward by the installer to position the lower tray 114b and/or the cable connectors 116 (shown in FIG. 6) in proper position with respect to the backplane 120 and openings 122 (shown in FIG. 3). When the lower tray 114b is lifted off of the upper hanging guide 238a, the weight of the lower tray 114b is no longer supported by the upper tray 114a. When the lower tray 114b is secured to the backplane 120, the backplane 120 supports the weight of the lower tray 114b.

Returning to FIG. 2, the upper and lower trays 114a, 114b are loaded into the chassis 110 in pairs with the chassis 110 guiding and supporting the upper trays 114a and with the upper trays 114a and the chassis 110 guiding and supporting the lower trays 114b. Any of the interior trays 114 may be removed and replace by sliding such tray 114 out of the chassis 110 and cable rack 112 without needing to disassemble the entire cable rack 112. The guide and support system 118 for the trays 114, defined by the chassis guides 130, 132, the tray guides 230 and the hanging guides 236, 238 and/or other features, allows the installer the benefits of placing the brunt of the weight of the trays 114 on the chassis 110 and/or other trays 114 during tray installation and extraction. The guide and support system 118 creates a means of supporting the trays 114 during installation, such as to promote pre-alignment, to prevent damage to the tray 114 and cable connectors 116 and/or to provide ease of installation and extraction of the trays 114 from the chassis 110.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A cable backplane system comprising:
   a backplane having a plurality of openings therethrough;
   a chassis supporting the backplane, the chassis having an upper support and a lower support with a space therebetween behind the backplane, the upper support having chassis guides; and
   a cable rack received in the space between the upper and lower supports and coupled to the chassis and backplane, the cable rack comprising a plurality of trays extending longitudinally between first and second ends, the trays being stacked and configured to hang from the upper support of the chassis with the first ends facing the upper support and the second ends facing the lower support, the trays each having a frame and cable connector assemblies held by the corresponding frame, each cable connector assembly having a plurality of cables extending between at least two cable connectors, the cables being routed in the frame, the trays having tray guides at the first ends configured to interact with corresponding chassis guides for supporting the trays from the upper support relative to the backplane for loading the cable connectors into corresponding openings in the backplane.

2. The cable backplane system of claim 1, wherein the tray guide receives the corresponding chassis guide such that the chassis supports the weight of the tray to assist in aligning the cable connectors with the corresponding openings in the backplane.

3. The cable backplane system of claim 1, wherein the chassis guides comprise T-shaped posts and the tray guides comprise T-shaped channels that receive the posts of the chassis guides.

4. The cable backplane system of claim 1, wherein the tray guides float relative to the chassis guides to allow the trays to be moved to align the cable connectors with the corresponding openings in the backplane.

5. The cable backplane system of claim 1, wherein the tray guides are lifted off of the chassis guides to position the trays relative to the backplane, the trays are secured to the backplane such that the backplane supports the weight of the trays after the trays are secured to the backplane.

6. The cable backplane system of claim 1, wherein the tray guides and chassis guides are used to temporarily support the trays for aligning to the backplane, the trays being secured to the backplane once positioned such that the backplane supports the weight of the trays.

7. The cable backplane system of claim 1, wherein the trays hang vertically between the upper and lower supports, the trays being stacked adjacent each other in a stacked configuration.

8. The cable backplane system of claim 1, wherein the trays are configured to support lower trays to align the lower trays to the backplane.

9. The cable backplane system of claim 1, wherein the chassis guides comprise upper chassis guides, the trays comprise upper trays, the tray guides comprise upper tray guides, the lower support having lower chassis guides, the cable rack further comprising lower trays, the lower trays having lower tray guides configured to interact with corresponding lower chassis guides for aligning the lower trays to the backplane for loading cable connectors of the lower tray in corresponding openings in the backplane.

10. The cable backplane system of claim 9, wherein the lower trays are coupled to and supported by corresponding upper trays.

11. The cable backplane system of claim 9, wherein the upper trays comprise upper hanging guides, the lower trays comprising lower hanging guides coupled to corresponding upper hanging guides to support the lower tray with the upper tray relative to the backplane for loading the cable connectors of the lower tray in the corresponding openings in the backplane.

12. The cable backplane system of claim 9, wherein the upper tray comprises a first section and a second section extending from the first section of the upper tray, the first section of the upper tray being wider than the second section of the upper tray, a first pocket being defined in the space below the first section and alongside the second section of the upper tray, the lower tray comprising a first section and a second section extending from the first section of the lower tray, the first section of the lower trade being wider than the second section of the lower tray, a second pocket being defined in a space above the first section and alongside the second section of the lower tray, the second section of the lower tray being received in the first pocket, the second section of the upper tray being received in the second pocket, the first section of the lower tray being positioned below the second section of the upper tray.

13. A cable backplane system comprising:
a backplane having a plurality of openings therethrough;
a chassis supporting the backplane, the chassis having an upper support and a lower support with side supports between the upper and lower supports, the upper support having upper chassis guides, the lower support having lower chassis guides; and
a cable rack coupled to the chassis and backplane between the upper and lower supports, the cable rack comprising a plurality of upper trays and a plurality of lower trays, each of the upper and lower trays having a frame and cable connector assemblies held by the corresponding frame, each cable connector assembly having a plurality of cables extending between at least two cable connectors, the cables being routed in the frame, the upper trays having upper tray guides configured to interact with corresponding upper chassis guides and hung from the upper support for supporting the upper trays relative to the backplane during assembly and loading the cable connectors into corresponding openings in the backplane, the lower trays having lower tray guides configured to interact with corresponding lower chassis guides for aligning the lower trays to the backplane for loading cable connectors of the lower tray in corresponding openings in the backplane.

14. The cable backplane system of claim 13, wherein the lower trays are coupled to and supported by corresponding upper trays.

15. The cable backplane system of claim 13, wherein the upper trays comprise upper hanging guides, the lower trays comprising lower hanging guides coupled to corresponding upper hanging guides to support the lower tray with the upper tray relative to the backplane for loading the cable connectors of the lower tray in the corresponding openings in the backplane.

16. The cable backplane system of claim 13, wherein the upper tray comprises a first section and a second section extending from the first section of the upper tray, the first section of the upper tray being wider than the second section of the upper tray, a first pocket being defined in the space below the first section and alongside the second section of the upper tray, the lower tray comprising a first section and a second section extending from the first section of the lower tray, the first section of the lower trade being wider than the second section of the lower tray, a second pocket being defined in a space above the first section and alongside the second section of the lower tray, the second section of the lower tray being received in the first pocket, the second section of the upper tray being received in the second pocket, the first section of the lower tray being positioned below the second section of the upper tray.

17. The cable backplane system of claim 13, wherein the upper tray guide receives the corresponding upper chassis guide such that the chassis supports the weight of the upper tray to assist in aligning the cable connectors with the corresponding openings in the backplane.

18. The cable backplane system of claim 13, wherein the upper tray guides float relative to the upper chassis guides to allow the upper trays to be moved to align the cable connectors with the corresponding openings in the backplane.

19. A cable backplane system comprising:
a backplane having a plurality of openings therethrough;
a chassis supporting the backplane, the chassis having an upper support and a lower support with side supports between the upper and lower supports, the upper support having upper chassis guides; and
a cable rack coupled to the chassis and backplane between the upper and lower supports, the cable rack comprising a plurality of upper trays and a plurality of lower trays, each of the upper and lower trays having a frame and cable connector assemblies held by the corresponding frame, each cable connector assembly having a plurality of cables extending between at least two cable connectors, the cables being routed in the frame, the upper trays having upper tray guides configured to interact with corresponding upper chassis guides for supporting the upper trays from the upper support relative to the backplane, the upper trays comprise upper hanging guides, the lower trays comprising lower hanging guides coupled to corresponding upper hanging guides to support the lower trays from the corresponding upper trays relative to the backplane.

20. The cable backplane system of claim 19, wherein the lower support has lower chassis guides and the lower trays have lower tray guides, the lower tray guides being configured to interact with corresponding lower chassis guides for aligning the lower trays to the backplane for loading the cable connectors of the lower tray in corresponding openings in the backplane.

* * * * *